US012610660B2

(12) United States Patent (10) Patent No.: US 12,610,660 B2

Liu (45) Date of Patent: Apr. 21, 2026

(54) INFRARED LIGHT EMITTER

(71) Applicant: National Tsing Hua University, Hsinchu City (TW)

(72) Inventor: Chang-Hua Liu, Hsinchu City (TW)

(73) Assignee: National Tsing Hua University, Hsinchu City (TW)

( * ) Notice: Subject to any disclaimer, the term of this patent is extended or adjusted under 35 U.S.C. 154(b) by 445 days.

(21) Appl. No.: 18/479,109

(22) Filed: Oct. 1, 2023

(65) Prior Publication Data

US 2024/0339563 A1 Oct. 10, 2024

(30) Foreign Application Priority Data

Apr. 6, 2023 (TW) .................................. 112112839

(51) Int. Cl.
　*H10H 20/816* (2025.01)
　*H10H 20/813* (2025.01)
(52) U.S. Cl.
　CPC ...... *H10H 20/8162* (2025.01); *H10H 20/813* (2025.01)
(58) Field of Classification Search
　CPC ............... H10H 20/817; H10H 20/813; H10H 20/8162; H10H 20/8131
　See application file for complete search history.

(56) References Cited

U.S. PATENT DOCUMENTS

2012/0080697 A1* 4/2012 Chen .................... H10H 20/856
　　　　　　　　　　　　　　　　　257/91
2016/0359300 A1* 12/2016 El-Ghoroury ......... H01S 5/0622

2018/0047868 A1* 2/2018 David .................. H10H 20/813
2019/0290929 A1 9/2019 Jiao
2021/0167250 A1* 6/2021 Shibata ................ H10H 20/813
2024/0405162 A1* 12/2024 Kim ........................ H10H 20/84
(Continued)

FOREIGN PATENT DOCUMENTS

CN　　112216729　　1/2021
KR　　20130006844 A　*　1/2013　............. H10H 20/82
KR　　20130039353 A　*　4/2013　............. H10H 20/83
(Continued)

OTHER PUBLICATIONS

"Black phosphorus-based van der Waals heterostructures for mid-infrared light-emission applications" by Zong et al. (Year: 2020).*
(Continued)

*Primary Examiner* — Evren Seven
(74) *Attorney, Agent, or Firm* — JCIPRNET

(57) ABSTRACT

An infrared light emitter includes a substrate, a first light-emitting layer, a blocking layer, and a second light-emitting layer. The second light-emitting layer is disposed on the substrate, the blocking layer is disposed on the second light-emitting layer, and the first light-emitting layer is disposed on the blocking layer. The first light-emitting layer, the blocking, and the second light-emitting layer form a P-N-P junction or an N-P-N junction. The first light-emitting layer and the blocking layer form a first electroluminescent unit, and the blocking layer and the second light-emitting layer form a second electroluminescent unit. The first electroluminescent unit and the second electroluminescent unit build two back-to-back bipolar junctions.

11 Claims, 11 Drawing Sheets

(56) References Cited

U.S. PATENT DOCUMENTS

2025/0183236 A1 * 6/2025 Xu ........................ H10H 20/857

FOREIGN PATENT DOCUMENTS

| | | | | | |
|---|---|---|---|---|---|
| KR | 102049384 B1 | * | 11/2019 | ............ | H10H 20/85 |
| TW | 200539461 | | 12/2005 | | |
| TW | 201635585 | | 10/2016 | | |
| WO | WO-0045443 A1 | * | 8/2000 | ........... | H10H 20/814 |
| WO | 2020186428 | | 9/2020 | | |

OTHER PUBLICATIONS

"Mid-infrared light-emitting properties and devices based on thin-film black phosphorus" by Zong et al. (Year: 2021).*

Geonyeop Lee et al., "Two-Dimensionally Layered p-Black Phosphorus/n-MoS2/p-Black Phosphorus Heterojunctions", ACS Appl. Mater. Interfaces, Feb. 27, 2018, pp. 10347-10352.

James Bullock et al., "Polarization-resolved black phosphorus/molybdenum disulfide mid-wave infrared photodiodes with high detectivity at room temperature", Nature Photonics, Aug. 27, 2018, pp. 601-608.

Tian-Yun Chang et al., "Van der Waals Heterostructure Photodetectors with Bias-Selectable Infrared Photoresponses", ACS Appl. Mater. Interfaces, Jul. 7, 2022, pp. 32665-32674.

Liwei Liu et al., "Van der Waals Bipolar Junction Transistor Using Vertically Stacked Two-Dimensional Atomic Crystals", Advanced Functional Materials, Feb. 4, 2019, pp. 1-9.

Geonyeop Lee et al., "2D Material-Based Vertical Double Heterojunction Bipolar Transistors with High Current Amplification", Advanced Electronic Materials, Dec. 27, 2018, pp. 1-7.

Po-Liang Chen et al., "Van der Waals Heterostructure Mid-Infrared Emitters with Electrically Controllable Polarization States and Spectral Characteristics", ACS Nano, May 22, 2023, pp. 10181-10190.

"Office Action of Taiwan Counterpart Application", issued on Dec. 20, 2023, p. 1-p. 5.

* cited by examiner

INFRARED LIGHT EMITTER

CROSS-REFERENCE TO RELATED APPLICATION

This application claims the priority benefit of Taiwan application serial no. 112112839, filed on Apr. 6, 2023. The entirety of the above-mentioned patent application is hereby incorporated by reference herein and made a part of this specification.

BACKGROUND

Technical Field

The disclosure relates to a light emitter, in particular to an infrared light emitter.

Description of Related Art

Mid-infrared light emitters are widely used in industrial, environmental engineering, medical, security, and safety monitoring applications, in addition to mid-infrared imaging and spectrometer systems. The mid-infrared light emitters enhance the contrast of other dimensions to reveal a hidden surface or the composition and functional properties of chemical. In addition, the mid-infrared light emitters play an important role in modern optical communication systems.

Although the mid-infrared light emitters have such diverse applications, a series of optical and mechanical components are often required to modulate their spectral characteristics and polarization. This is not only expensive, but also limits the possibility of system miniaturization. Based on the aforementioned problems, a mid-infrared light emitter with electrically controllable polarization and spectrum has emerged, and the commonly used mid-infrared light emitter is made of Group III-V or II-VI semiconductor materials. The mid-infrared light emitters made by semiconductor processes also pose several problems. First, the light of this type of emitter is not characteristically polarized. Second, a multi-layer structure and more than three electrodes are required to independently control each electroluminescent unit. In addition, the lattice and thermal properties may be mismatched in the semiconductor process.

SUMMARY

The disclosure provides an infrared light emitter, capable of reducing optical and mechanical components required to work therewith, and reducing lattice or thermodynamic mismatches in a process of the infrared light emitter.

The infrared light emitter of the disclosure includes a substrate, a first light-emitting layer, a second light-emitting layer, and a blocking layer. The second light-emitting layer is disposed on the substrate. The blocking layer is disposed between the first light-emitting layer and the second light-emitting layer, and the first light-emitting layer, the blocking layer, and the second light-emitting layer form a P-N-P junction or an N-P-N junction. The first light-emitting layer and the blocking layer form a first electroluminescent unit, and the second light-emitting layer and the blocking layer form a second electroluminescent unit.

Based on the above, embodiments of the disclosure may change optical characteristics of the infrared light emitter, such as a wavelength, spectrum, and polarization of emitted infrared light, by modulating a driving bias voltage. In addition, the embodiments of the disclosure facilitates miniaturization of the infrared light emitter.

To make the aforementioned more comprehensive, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
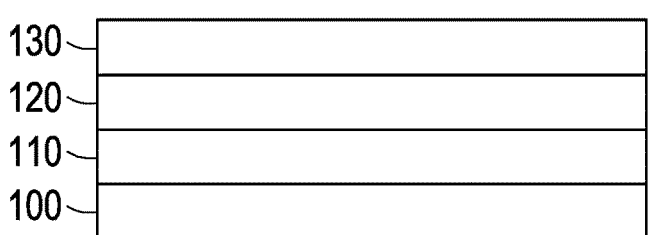
FIG. 1 is a schematic cross-sectional diagram of a light emitter according to an embodiment of the disclosure.

FIG. 1 is a schematic cross-sectional diagram of a light emitter according to an embodiment of the disclosure.

Referring to FIG. 1, a light emitter of this embodiment includes a substrate 100, a first light-emitting layer 130, a second light-emitting layer 110, and a blocking layer 120.

The second light-emitting layer 110 is disposed on the substrate 100, and the blocking layer 120 is disposed between the first light-emitting layer 130 and the second light-emitting layer 110. In this embodiment, the second light-emitting layer 110 is disposed on an upper surface of the substrate 100 and is in direct contact with the upper surface of the substrate 100, and the second light-emitting layer 110 is located between the substrate 100 and the blocking layer 120.

In a layered structure shown in FIG. 1, the substrate 100 is, for example, a semiconductor substrate, and materials of the first light-emitting layer 130, the second light-emitting layer 110, and the blocking layer 120 are all van der Waals materials, for example. In this embodiment, the substrate 100 includes a silicon substrate with a silicon dioxide layer on the upper surface. A material of the first light-emitting layer 130 includes black phosphorus, black arsenic phosphorus or other van der Waals materials suitable as a light-emitting layer. The blocking layer 120 may be an electron hole blocking layer, and a material of the electron hole blocking layer includes molybdenum disulfide or other van der Waals materials suitable for the electron hole blocking layer. A material of the second light-emitting layer 110 includes black phosphorus, black arsenic phosphorus or other van der Waals materials suitable for the light-emitting layer. A ratio of arsenic to phosphorus in the black arsenic phosphorus may be adjusted depending on the demand. For example, the black arsenic phosphorus may be b-$As_{0.46}P_{0.54}$ or b-$As_{0.25}P_{0.75}$. In addition, the light emitter may also be made of Group III-V or II-VI semiconductor materials, or suitable organic polymer materials, the disclosure is not limited to the aforementioned materials.

An advantage of using van der Waals materials is that order of the materials may be selected and the materials may be stacked vertically to form elements according to a lattice direction in the material. In addition, another advantage of van der Waals materials is that they have a wide range of optical band gaps and their electromagnetic spectra span from ultraviolet band to megahertz band.

The infrared light emitter illustrated in this embodiment of the disclosure has a variety of optical properties. For example, when bias voltages of different polarities are applied to the infrared light emitter, one of the electroluminescent units of the infrared light emitter (e.g., a first electroluminescent unit including the first light-emitting layer 130 or a second electroluminescent unit including the second light-emitting layer 110) is driven to emit infrared light with a specific wavelength and a specific polarization state. In some embodiments, the emission wavelength and the polarization state of the infrared light emitter may vary with the polarity of the applied bias voltage. In some embodiments, a driving bias voltage modulator continuously and periodically applies a driving bias voltage with a specific waveform to the infrared light emitter, and an appropriate modulation of the driving bias voltage by the driving bias voltage modulator changes an emission spectrum generated by the infrared light emitter.

In some embodiments of the disclosure, the van der Waals materials may be obtained by mechanical peeling in a glove box in an inert atmosphere. Next, a lattice alignment direction of the torn van der Waals materials is measured. Then, in the glove box, the materials are stacked vertically on the substrate in a selected order and in the lattice direction of the materials by a dry transfer method to form a laminar structure of the light emitter as shown in FIG. 2.

Figure 2:
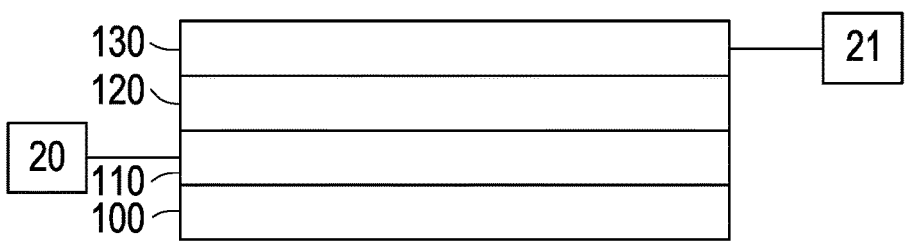
FIG. 2 is a schematic cross-sectional diagram of an infrared light emitter including electrodes according to an embodiment of the disclosure.

FIG. 2 is a schematic cross-sectional diagram of a light emitter formed after materials are stacked. Referring to FIG.

2, in some embodiments, the second light-emitting layer 110, the blocking layer 120, and the first light-emitting layer 130 have been formed on the substrate 100, in which the second light-emitting layer 110 is electrically connected to an electrode 20. In some embodiments, the electrode 20 is a laminated metal electrode. For example, the electrode 20 includes a chromium/gold (Cr/Au) laminated electrode, and a chromium electrode layer in the electrode 20 overlays a gold electrode layer, in which the chromium electrode layer has a thickness of about 5 nm, and the gold electrode layer in the electrode 20 has a thickness of about 30 nm. In addition, the first light-emitting layer 130 is electrically connected to an electrode 21. The electrode 21 is a laminated metal electrode. For example, the electrode 21 includes a chromium/gold (Cr/Au) laminated electrode, and a chromium electrode layer in the electrode 21 overlays a gold electrode layer, in which the chromium electrode layer has a thickness of about 5 nm, and the gold electrode layer in the electrode 21 has a thickness of about 30 nm. The blocking layer 120 is located on the second light-emitting layer 110 and is in direct contact with the second light-emitting layer 110, and the first light-emitting layer 130 is located on the blocking layer 120 and is in direct contact with the blocking layer 120. In this embodiment, an arm-chair lattice direction of the first light-emitting layer 130 is orthogonal to an arm-chair lattice direction of the second light-emitting layer 110.

As shown in FIG. 2, the blocking layer 120 is an electron hole blocking layer, and the first light-emitting layer 130, the blocking layer 120, and the second light-emitting layer 110 form a P-N-P junction. The first light-emitting layer 130 and the blocking layer 120 may form a first electroluminescent unit 140, the second light-emitting layer 110 and the blocking layer 120 may form a second electroluminescent unit 150, and the first electroluminescent unit 140 and the second electroluminescent unit 150 build two back-to-back bipolar junctions. In other embodiments, the blocking layer 120 may be an electron blocking layer, and the first light-emitting layer 130, the blocking layer 120, and the second light-emitting layer 110 form an N-P-N junction. The first light-emitting layer 130 and the blocking layer 120 may form the first electroluminescent unit 140, the second light-emitting layer 110 and the blocking layer 120 may form the second electroluminescent unit 150, and the first electroluminescent unit 140 and the second electroluminescent unit 150 build two back-to-back bipolar junctions.

A bias voltage is applied to the light emitter including two back-to-back bipolar junctions, and light emitted by the light emitter is received through a red light spectrometer to obtain an electroluminescence intensity spectrum of the light emitter in an infrared band (e.g., a mid-infrared band with a wavelength range between 3 μm and 14 μm).

In some embodiments of the disclosure, an AC bias voltage signal including multiple positive bias voltages and negative bias voltages alternately arranged in time sequence may be applied to the light emitter, and current-bias voltage relationship of the light emitter and quantum efficiency-bias voltage relationship of the light emitter may be measured. The current-bias voltage relationship may illustrate a bias voltage switchable property of the light emitter, while the quantum efficiency-bias voltage relationship may tell the quantum efficiency of the light emitter up to 0.3%.

In some embodiments of the disclosure, electroluminescent properties of the light emitter may be modulated by selecting polarity of the bias voltage applied to the light emitter (i.e., positive bias voltage or negative bias voltage). In some embodiments, a change in the polarity of the applied bias voltage will result in a change in the emission wavelength and/or polarization direction of the light emitter.

In some embodiments of the disclosure, a radio frequency signal with a frequency of about 3 MHz may be applied to the light emitter. For example, a driving bias voltage including multiple positive bias voltages and negative bias voltages alternately arranged in time sequence may be applied to the light emitter, and duration of the positive bias voltages and the negative bias voltages in the driving bias voltage may be appropriately adjusted by the driving bias voltage modulator to turn on and off the first electroluminescent unit and the second electroluminescent unit respectively at different frequencies. Based on the above, fast conversion between the two electroluminescent units in the light emitter is feasible. In addition, the driving of the first electroluminescent unit and the second electroluminescent unit by the driving bias voltage modulator (i.e., adjusting the duration of the positive bias voltages and the negative bias voltages in the driving bias voltage) makes it possible to modulate the emission spectrum of the light emitter.

Experimental Example 1

In this experimental example, a light emitter is as shown in FIG. 2, and the light emitter includes a substrate 100, a second light-emitting layer 110 disposed on the substrate 100, a blocking layer 120 (i.e., an electron hole blocking layer) disposed on the second light-emitting layer 110, a first light-emitting layer 130 disposed on the blocking layer 120, an electrode 20 electrically connected to the second light-emitting layer 110, and an electrode 21 electrically connected to the first light-emitting layer 130. In this experimental example, a chromium electrode layer in the electrode 20 has a thickness of about 5 nm, and a gold electrode layer in the electrode 20 has a thickness of about 30 nm. A chromium electrode layer in electrode 21 has a thickness of about 5 nm, and a gold electrode layer in electrode 21 has a thickness of about 30 nm.

In this experimental example, the first light-emitting layer 130 is a black phosphorus layer with a thickness of about 38 nm, the second light-emitting layer 110 is a black phosphorus layer with a thickness of about 47 nm, and the blocking layer 120 is a molybdenum disulfide layer with a thickness of about 7.2 nm, but the disclosure is not limited thereto. In a process of manufacturing stacked material layers in the light emitter, an arm-chair lattice direction of the first light-emitting layer 130 is, for example, orthogonal to an arm-chair lattice direction of the second light-emitting layer 110.

The first light-emitting layer 130, the blocking layer 120, and the second light-emitting layer 110 formed on the substrate 100 form a P-N-P junction. The first light-emitting layer 130 and the blocking layer 120 form a first electroluminescent unit 140, the second light-emitting layer 110 and the blocking layer 120 form a second electroluminescent unit 150, and the first electroluminescent unit 140 and the second electroluminescent unit 150 build two back-to-back bipolar junctions.

Figure 3:
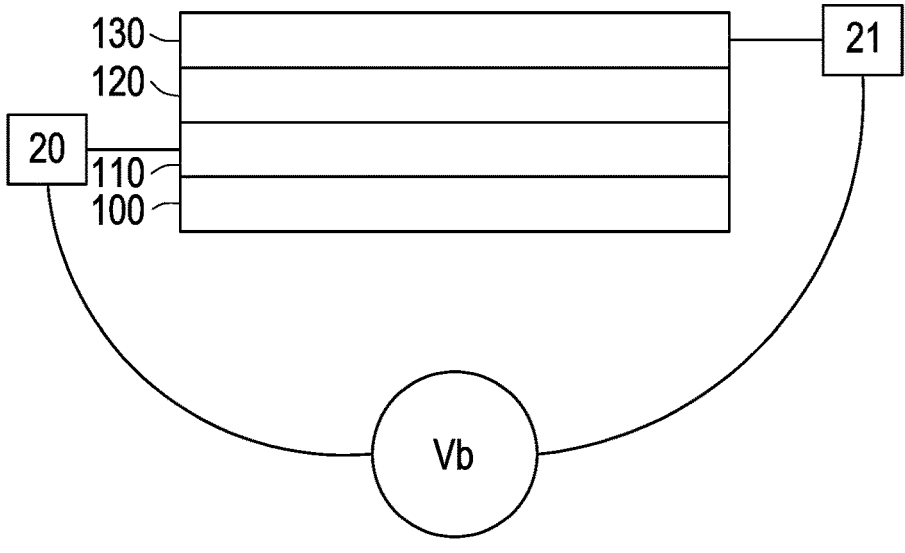
FIG. 3 is a schematic diagram of an infrared light emitter applied with a bias voltage according to an embodiment of the disclosure.

In this experimental example, as shown in FIG. 3, a driving bias voltage $V_b$ is applied between the electrode 20 and the electrode 21 of the light emitter. The electrode 20 is grounded, the electrode 21 is electrically coupled to a voltage source, and the voltage source may be used to provide a voltage of −7 volts to +7 volts to the electrode 21. In a process of applying the driving bias $V_b$ between the electrode 20 and the electrode 21 of the light emitter, a current flowing through the light emitter is measured, and the current measured and a corresponding driving bias voltage $V_b$ thereof are illustrated in a current-bias voltage relationship diagram of the light emitter in FIG. 4.

Figure 4:
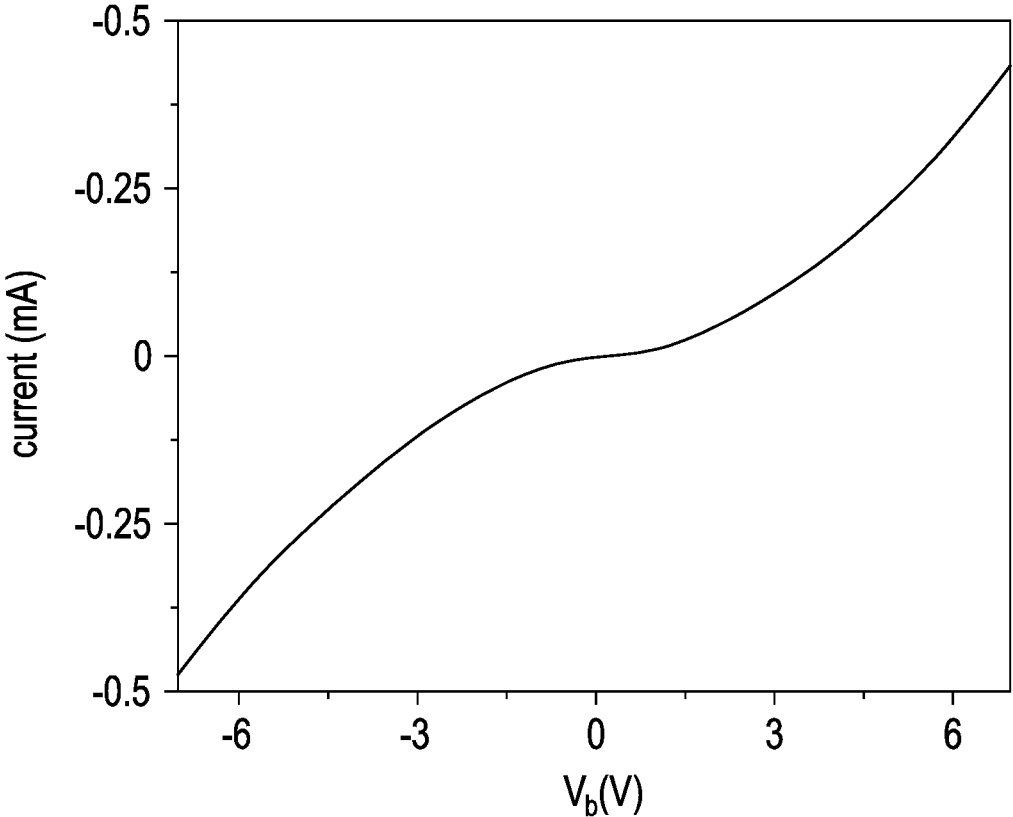
FIG. 4 is a current-bias voltage relationship diagram of an infrared light emitter according to an Experimental Example 1 of the disclosure.
Figures 5A, 5B:
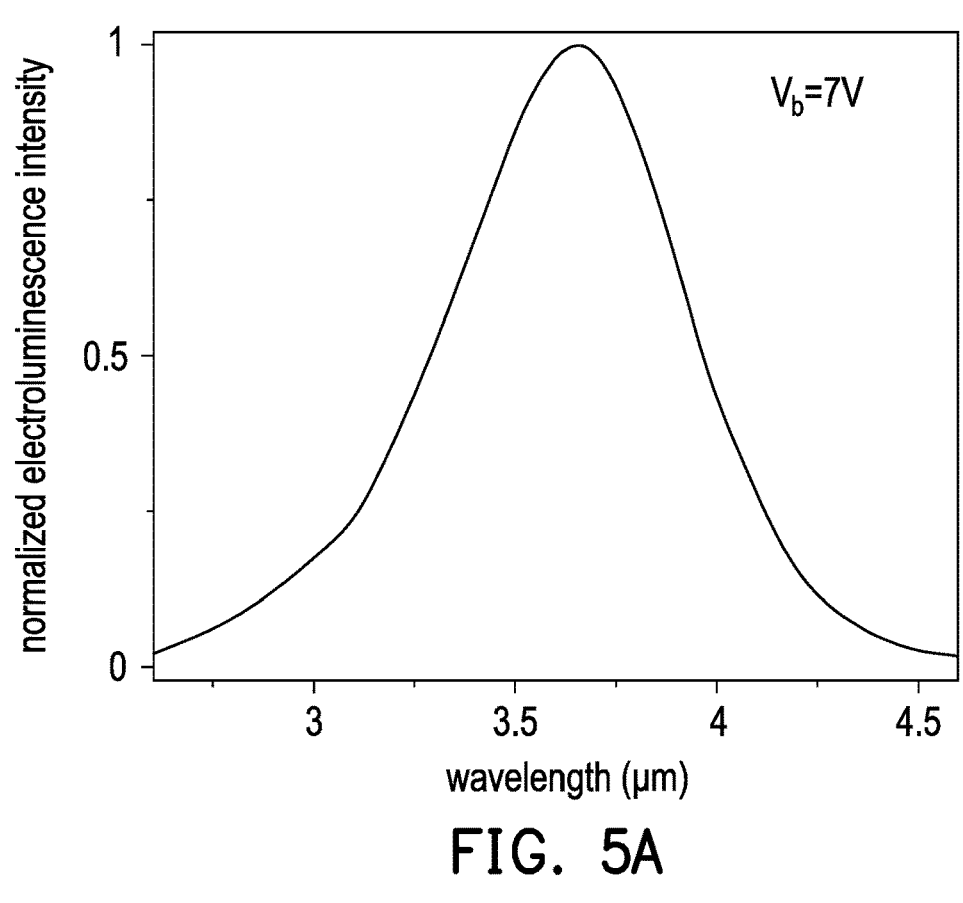
FIG. 5A and FIG. 5B are diagrams showing relationship between electroluminescence intensity at a bias voltage of +7 volts and −7 volts respectively according to the Experimental Example 1 of the disclosure.

Referring to FIG. 4, when a positive bias voltage is applied to the light emitter, the positive bias (e.g., +7 volts) is suitable for driving the first light-emitting layer 130 in the light emitter to emit light. When a negative bias voltage is applied to the light emitter, the negative bias voltage (e.g., −7 volts) is suitable for driving the second light-emitting layer 110 in the light emitter to emit light. As shown in FIG. 5A and FIG. 5B, when a positive bias voltage (e.g., +7 volts) is applied to the light emitter, a wavelength range of infrared light emitted by the first light-emitting layer 130 in the light emitter falls within a wavelength range of mid-infrared light (3 μm to 5 μm); when a negative bias voltage (e.g., −7 volts) is applied to the light emitter, a wavelength range of infrared light emitted by the second light-emitting layer 110 in the light emitter also falls within the wavelength range of the mid-infrared light (3 μm to 5 μm). When the driving bias voltage applied to the light emitter is +7 volts or −7 volts, normalized intensity peaks of the mid-infrared light emitted by the first light-emitting layer 130 or the second light-emitting layer 110 occurs at a wavelength of about 3.67 μm.

Figure 6:
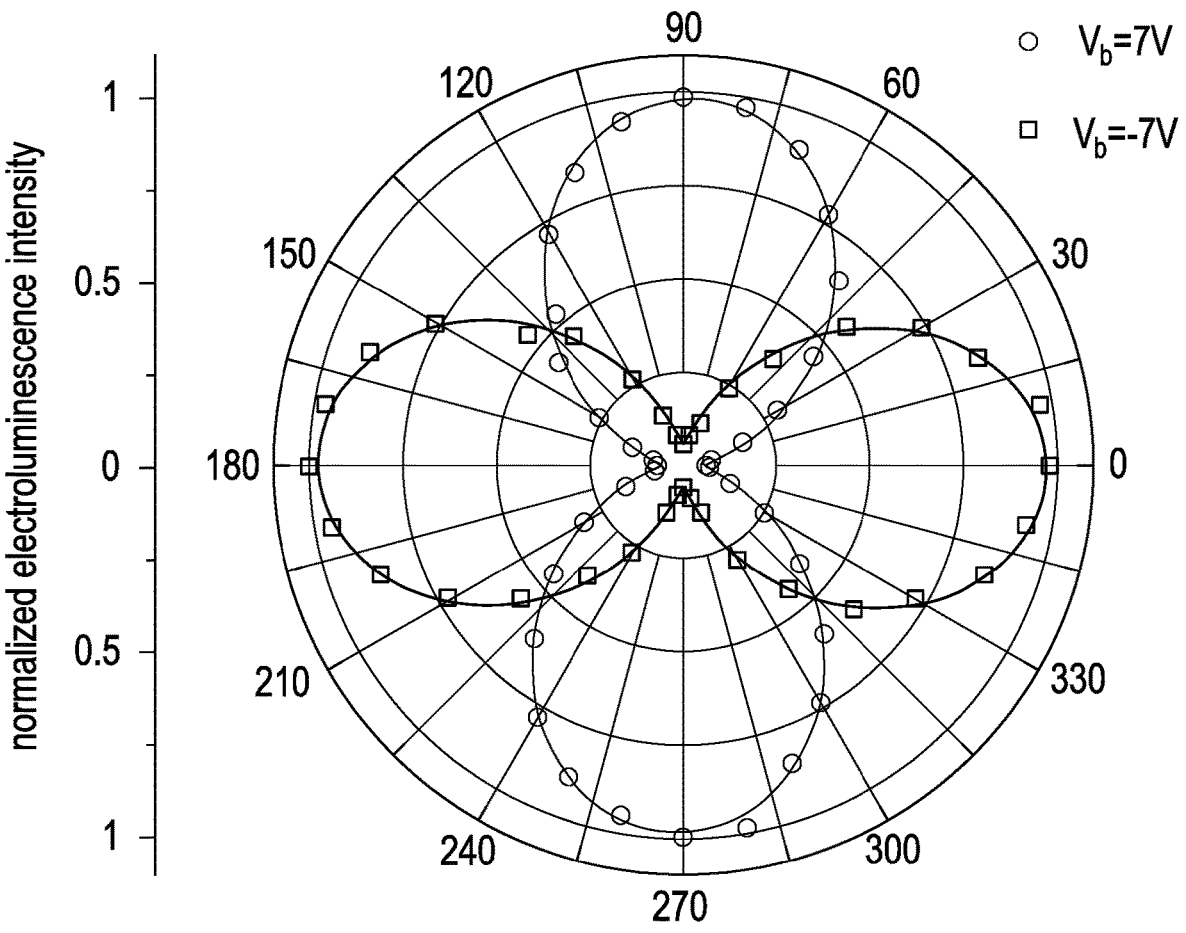
FIG. 6 is a linear polarization diagram of light emitted at a bias voltage of +7 volts and −7 volts respectively according to the Experimental Example 1 of the disclosure.

Referring to FIG. 6, when the driving bias voltage applied to the light emitter is +7 volts, the mid-infrared light emitted by the first light-emitting layer 130 is linearly polarized mid-infrared light; when the driving bias voltage applied to the light emitter is −7 volts, the mid-infrared light emitted by the second light-emitting layer 110 is also linearly polarized mid-infrared light, but the mid-infrared light emitted by the first light-emitting layer 130 is different from the mid-infrared light emitted by the second light-emitting layer 110 in the polarization direction. In detail, when the driving bias voltage applied to the light emitter is +7 volts, the polarization direction of the mid-infrared light emitted by the first light-emitting layer 130 is distributed in directions of 90 degrees and 270 degrees; when the driving bias voltage applied to the light emitter is −7 volts, the polarization direction of the mid-infrared light emitted by the second light-emitting layer 110 is distributed in directions of 0 degrees and 180 degrees.

A linear polarization degree $\rho_{-EL}$ of the mid-infrared light emitted by the light emitter may be measured by the following relation: $(I_{EL,max}-I_{EL,min})/(I_{EL,max}+I_{EL,min})$, where $I_{EL,max}$ and $I_{EL,min}$ are a maximum value and a minimum value of electroluminescence intensity, respectively. At a driving bias voltage of +7 volts, the linear polarization degree of the mid-infrared light emitted by the first light-emitting layer 130 is 88%, and at a driving bias voltage of −7 volts, the linear polarization degree of the mid-infrared light emitted by the second light-emitting layer 110 is 87%.

Based on the foregoing, in this experimental example, the polarization direction of the mid-infrared light emitted by different light-emitting layers in the light emitter may be adjusted by changing the polarity of the bias voltage applied to the light emitter. Accordingly, the light emitter in this experimental example may obtain mid-infrared light with similar wavelengths but different polarization states by switching polarity of the driving bias voltage. In addition, the first electroluminescent unit and the second electroluminescent unit in the light emitter may be independently controlled by modulating the polarity of the bias voltage.

Figure 7:
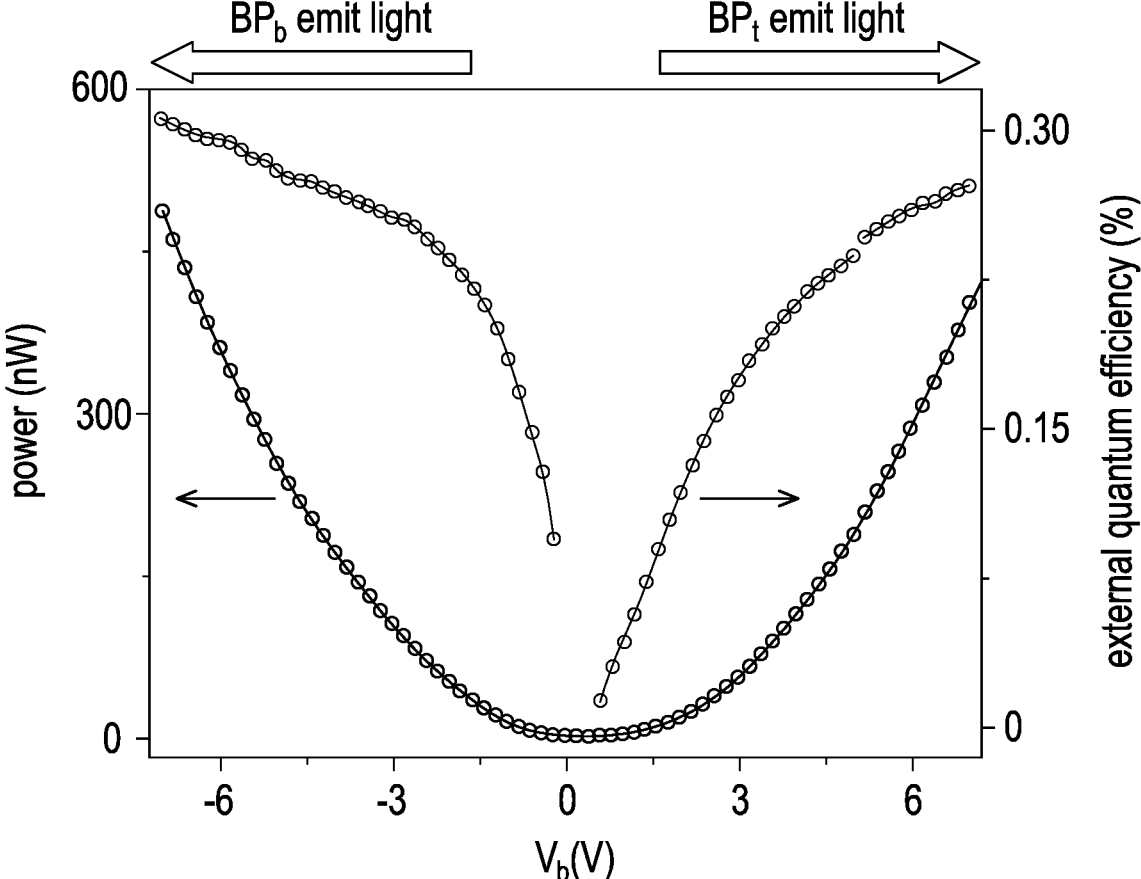
FIG. 7 is a quantum efficiency-bias voltage relationship diagram according to the Experimental Example 1 of the disclosure.

Referring to FIG. 7, $BP_b$ and $BP_t$ in FIG. 7 refer to the second light-emitting layer 110 and the first light-emitting layer 130 respectively. It can be seen from FIG. 7 that the quantum efficiency of the light emitter in this experimental example may reach up to 0.3%.

Experimental Example 2

In this experimental example, a light emitter is as shown in FIG. 2, and the light emitter includes a substrate 100, a second light-emitting layer 110 disposed on the substrate 100, a blocking layer 120 (i.e., an electron hole blocking layer) disposed on the second light-emitting layer 110, a first light-emitting layer 130 disposed on the blocking layer 120, an electrode 20 electrically connected to the second light-emitting layer 110, and an electrode 21 electrically connected to the first light-emitting layer 130. In this experimental example, a chromium electrode layer in the electrode 20 has a thickness of about 5 nm, and a gold electrode layer in the electrode 20 has a thickness of about 30 nm. A chromium electrode layer in electrode 21 has a thickness of about 5 nm, and a gold electrode layer in electrode 21 has a thickness of about 30 nm.

In this experimental example, the first light-emitting layer 130 is a black phosphorus layer with a thickness of about 39 nm, the second light-emitting layer 110 is a black phosphorus layer with a thickness of about 92 nm, and the blocking layer 120 is a molybdenum disulfide layer with a thickness of about 7.9 nm, but the disclosure is not limited thereto. In a process of manufacturing stacked material layers in the light emitter, an arm-chair lattice direction of the first light-emitting layer 130 is, for example, orthogonal to an arm-chair lattice direction of the second light-emitting layer 110.

The first light-emitting layer 130, the blocking layer 120, and the second light-emitting layer 110 formed on the substrate 100 form a P-N-P junction. The first light-emitting layer 130 and the blocking layer 120 form a first electroluminescent unit 140, the second light-emitting layer 110 and the blocking layer 120 form a second electroluminescent unit 150, and the first electroluminescent unit 140 and the second electroluminescent unit 150 build two back-to-back bipolar junctions.

In this experimental example, as shown in FIG. 3, a driving bias voltage $V_b$ is applied between the electrode 20 and the electrode 21 of the light emitter. The electrode 20 is grounded, the electrode 21 is electrically coupled to a voltage source, and the voltage source may be used to provide a voltage of −12.5 volts to 7.5 volts to the electrode 21. In a process of applying the driving bias $V_b$ between the electrode 20 and the electrode 21 of the light emitter, a current flowing through the light emitter is measured, and the current measured and a corresponding driving bias voltage $V_b$ thereof are illustrated in a current-bias voltage relationship diagram of the light emitter in FIG. 8.

Figure 8:
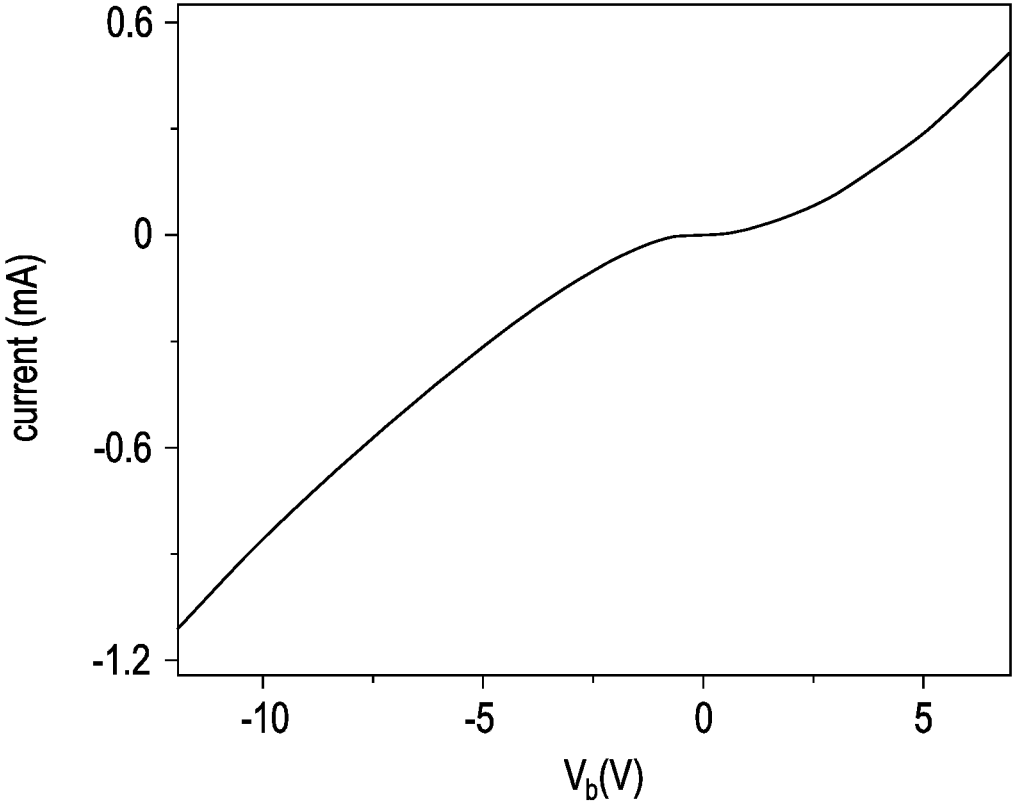
FIG. 8 is a current-bias voltage relationship diagram according to an Experimental Example 2 of the disclosure.
Figures 9A, 9B:
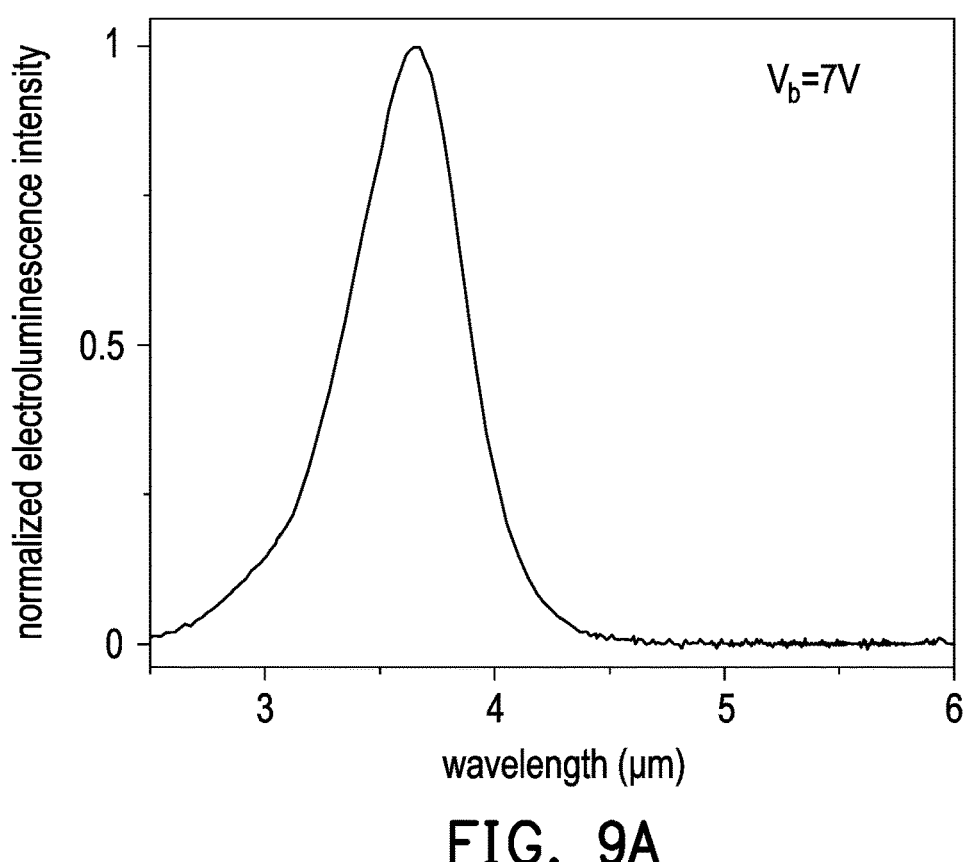
FIG. 9A and FIG. 9B are diagrams showing relationship between electroluminescence intensity at a bias voltage of +7 volts and −10 volts respectively according to the Experimental Example 2 of the disclosure.

Referring to FIG. 8, when a positive bias voltage is applied to the light emitter, the positive bias (e.g., +7 volts) is suitable for driving the first light-emitting layer 130 in the light emitter to emit light. When a negative bias voltage is applied to the light emitter, the negative bias voltage (e.g., −10 volts) is suitable for driving the second light-emitting layer 110 in the light emitter to emit light. As shown in FIG. 9A and FIG. 9B, when a positive bias voltage (e.g., +7 volts) is applied to the light emitter, a wavelength range of infrared light emitted by the first light-emitting layer 130 in the light emitter falls within a wavelength range of mid-infrared light (3 μm to 5 μm); when a negative bias voltage (e.g., −10 volts) is applied to the light emitter, a wavelength range of infrared light emitted by the second light-emitting layer 110 in the light emitter also falls within the wavelength range of the mid-infrared light (4 μm to 5 μm). When the driving bias voltage applied to the light emitter is +7 volts, normalized intensity peaks of the mid-infrared light emitted by the first light-emitting layer 130 occurs at a wavelength of about 3.67 μm, and when the driving bias voltage applied to the light emitter is −10 volts, normalized intensity peaks of the mid-infrared light emitted by the second light-emitting layer 110 occurs at a wavelength of about 4.6 μm.

Figure 10:
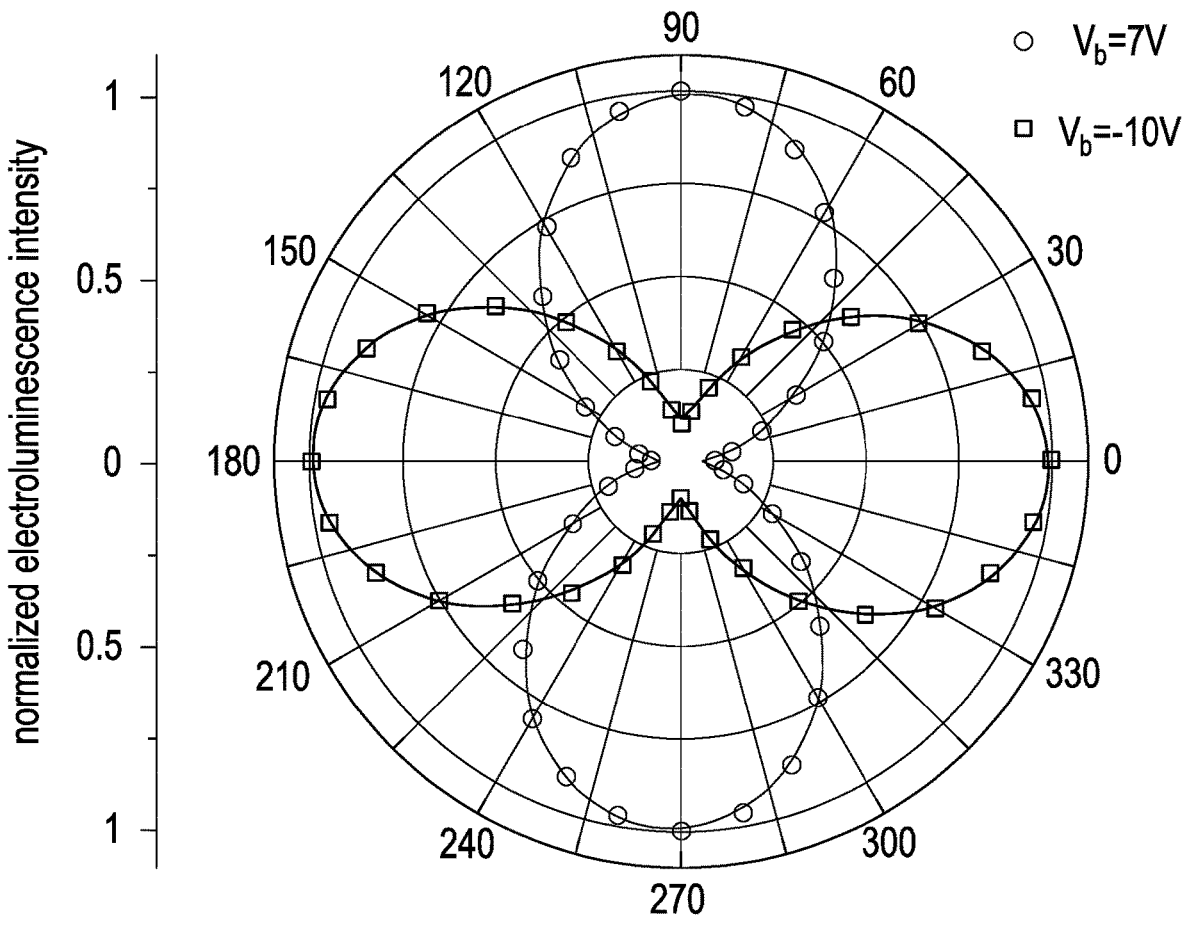
FIG. 10 is a linear polarization diagram of light emitted at a bias voltage of +7 volts and −10 volts respectively according to the Experimental Example 2 of the disclosure.

Referring to FIG. 10, when the driving bias voltage applied to the light emitter is +7 volts, the mid-infrared light emitted by the first light-emitting layer 130 is linearly polarized mid-infrared light; when the driving bias voltage applied to the light emitter is −10 volts, the mid-infrared light emitted by the second light-emitting layer 110 is also linearly polarized mid-infrared light, but the mid-infrared light emitted by the first light-emitting layer 130 is different from the mid-infrared light emitted by the second light-emitting layer 110 in the polarization direction. In detail, when the driving bias voltage applied to the light emitter is +7 volts, the polarization direction of the mid-infrared light emitted by the first light-emitting layer 130 is distributed in directions of 90 degrees and 270 degrees; when the driving bias voltage applied to the light emitter is −10 volts, the polarization direction of the mid-infrared light emitted by the second light-emitting layer 110 is distributed in directions of 0 degrees and 180 degrees.

Based on the foregoing, in this experimental example, the polarization direction of the mid-infrared light emitted by different light-emitting layers in the light emitter may be adjusted by changing the polarity of the bias voltage applied to the light emitter. Accordingly, the light emitter in this experimental example may obtain mid-infrared light with similar wavelengths but different polarization states by switching polarity of the driving bias voltage. In addition, the first electroluminescent unit and the second electroluminescent unit in the light emitter may be independently controlled by modulating the polarity of the bias voltage.

Experimental Example 3

In this embodiment, an AC bias voltage signal may be applied to the first electroluminescent unit and the second electroluminescent unit in the light emitter to alternately drive the first electroluminescent unit and the second electroluminescent unit in time sequence. The AC bias voltage signal applied to the light emitter includes multiple positive bias voltages and negative bias voltages alternately arranged, in which the positive bias voltages are used to drive the first electroluminescent unit having the first light-emitting layer 130, and the negative bias voltages are used to drive the first electroluminescent unit having the second light-emitting layer 110.

Figure 11A:
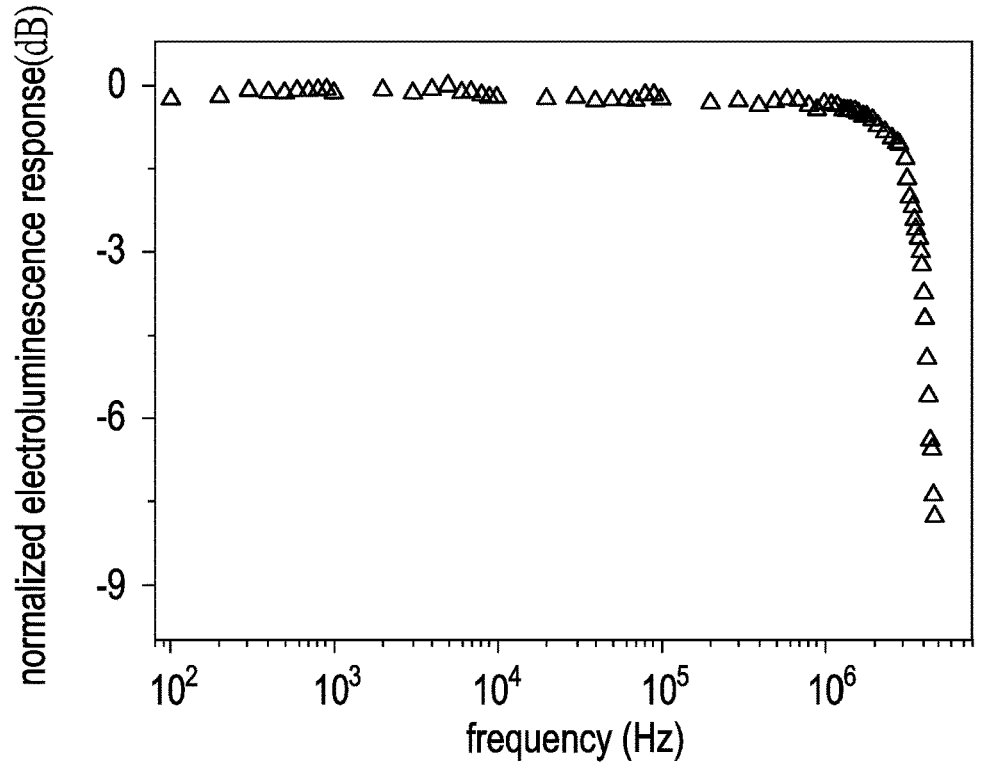
FIG. 11A and FIG. 11B are frequency response diagrams at a positive bias voltage and a negative bias voltage respectively according to an Experimental Example 3 of the disclosure.
Figure 11B:
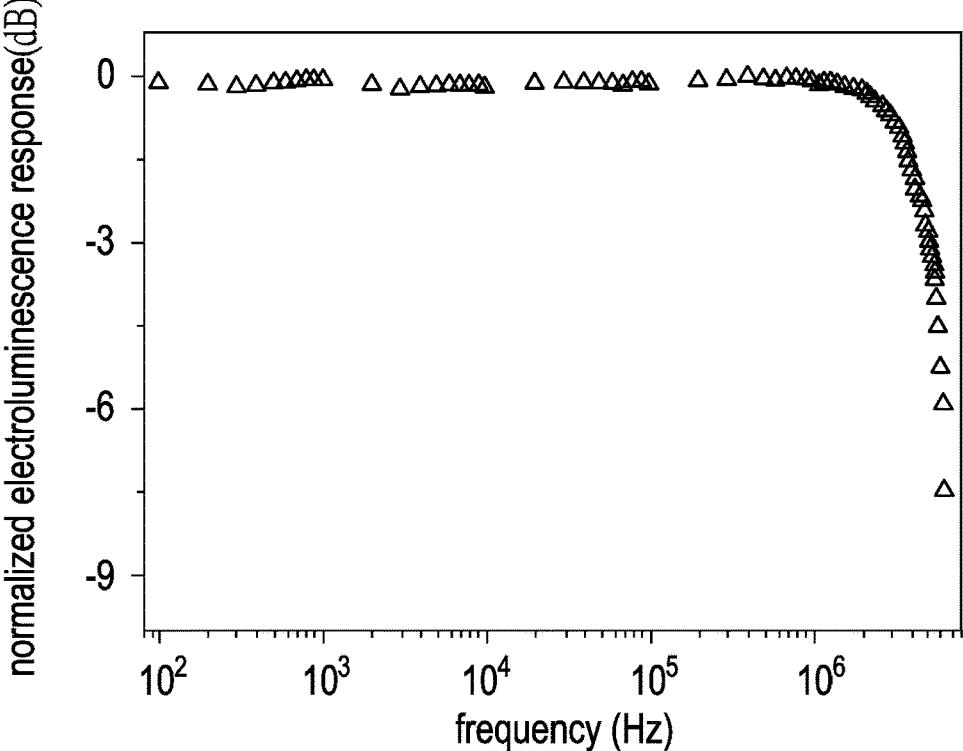

FIG. 11A illustrates relationship between driving frequency and normalized electroluminescence response when the first electroluminescent unit having the first light-emitting layer 130 (e.g., a black phosphorus layer) is driven with a positive bias voltage, and FIG. 11B illustrates relationship between driving frequency and normalized electroluminescence response when the second electroluminescent unit having the second light-emitting layer 110 (e.g., a black arsenic phosphorus layer) is driven with a negative bias voltage. As shown in FIG. 11A and FIG. 11B, a black phosphorus layer/molybdenum disulfide layer architecture in the first electroluminescent unit exhibited a bandwidth of 3.8 MHz with a response of up to 3 dB, while a black arsenic phosphorus layer/molybdenum disulfide layer in the second electroluminescent unit exhibits a bandwidth of 5 MHz with a response of up to 3 dB. The aforementioned difference in bandwidth helps to simplify signal encoding. For example, the mid-infrared light emitted by the first electroluminescent unit and the second electroluminescent unit may be encoded directly without an optical modulator.

Figure 12:
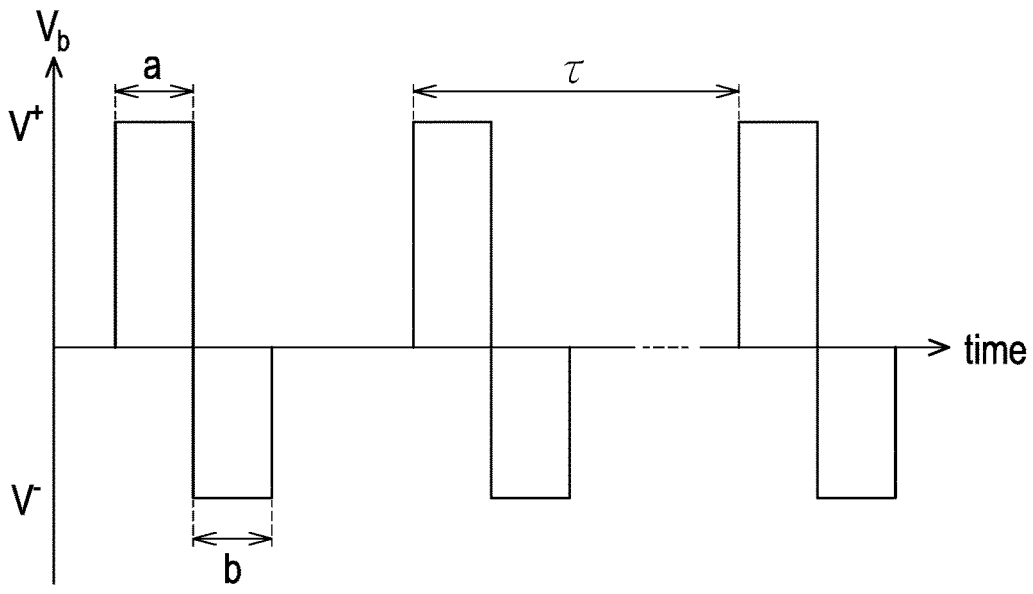
FIG. 12 is a schematic diagram of a periodic AC bias voltage according to the Experimental Example 3 of the disclosure.
Figure 13:
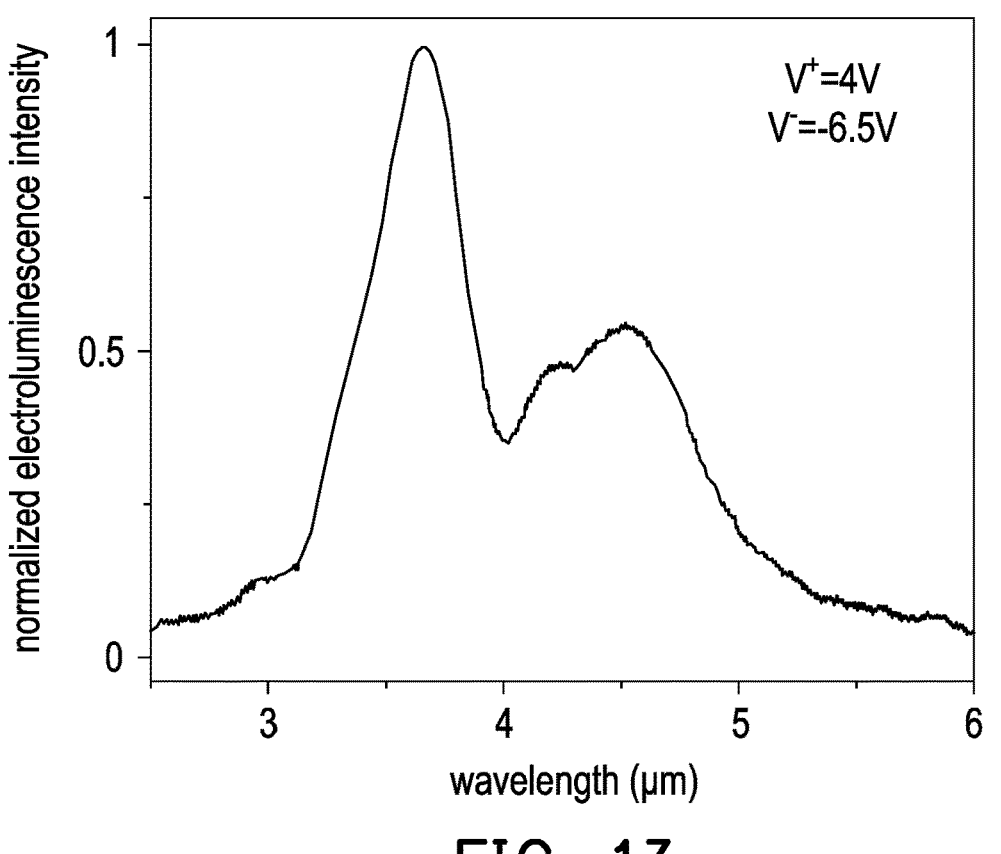
FIG. 13 is an electroluminescence intensity diagram obtained under an action of the periodic AC bias voltage according to the Experimental Example 3 of the disclosure.

In this experimental example, the emission spectrum of the light emitter may be changed by modulating a ratio in time of the positive bias voltage to the negative bias voltage in the AC bias voltage signal. The AC bias voltage signal is input to the light emitter, as shown in FIG. 12, a period of the AC bias voltage signal is t, and the AC bias voltage signal is composed of multiple pairs of pulses of opposite polarity. Amplitude of the positive bias voltage is $V^+$ and duration of action is a, while amplitude of the negative bias voltage is $V^-$ and duration of action is b. In this experimental example, a period of the AC bias voltage signal is 1 kHz, amplitude of the positive bias voltage is 4 volts, and amplitude of the negative bias voltage is −6.5 volts. As shown in FIG. 12, both the positive bias voltage and the negative bias voltage have a same duty cycle in a same period, i.e., the duration of action a is equal to the duration of action b. A result of the electroluminescent intensity of the light emitter obtained by driving the AC bias voltage signal is shown in FIG. 13.

Figure 14A:
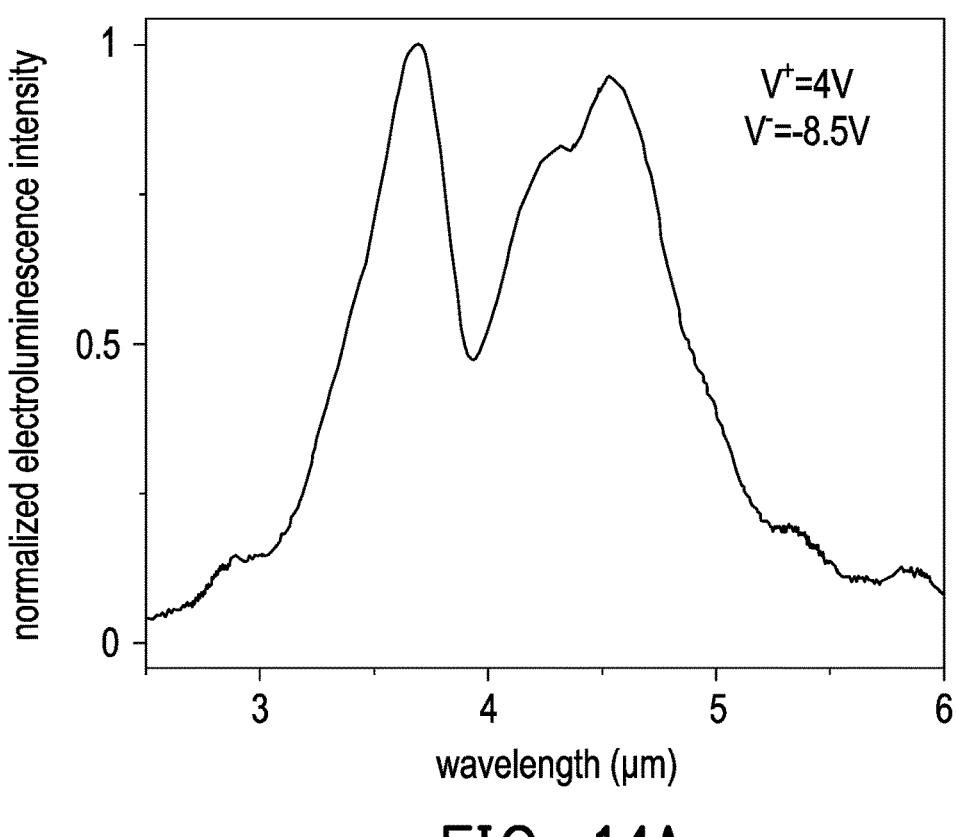
FIG. 14A and FIG. 14B are electroluminescence intensity diagrams under an action of a periodic AC bias voltage with a negative bias amplitude of −8.5 volts and −10 volts respectively according to the Experimental Example 3 of the disclosure.
Figure 14B:
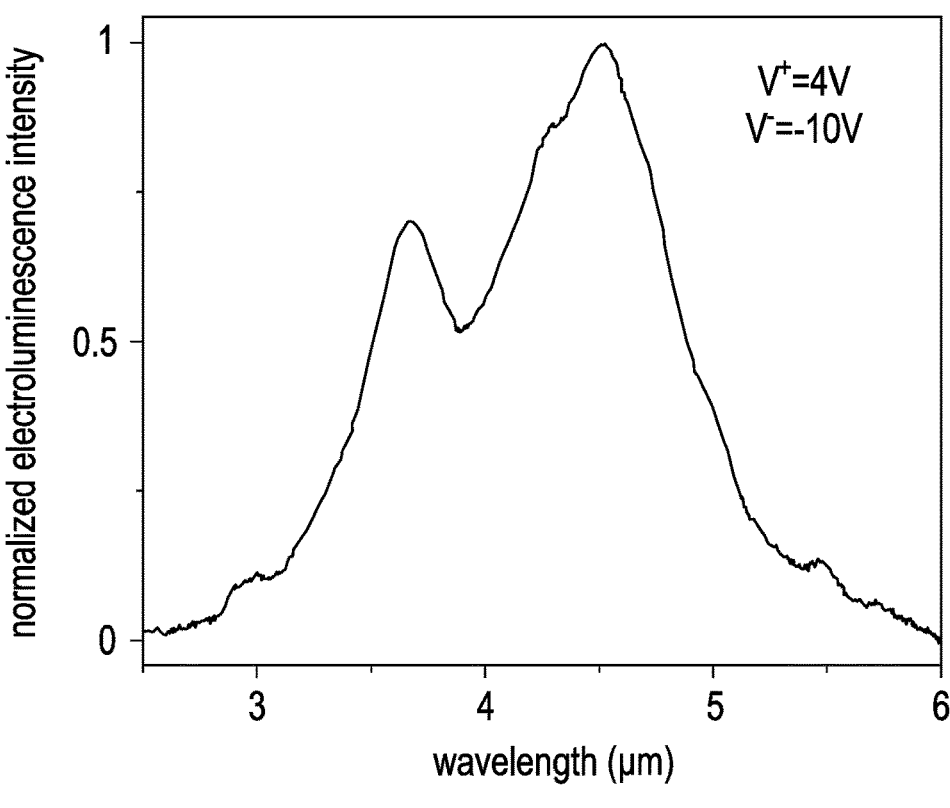

By changing the amplitude of the positive bias voltage and the negative bias voltage in the AC bias voltage signal, the emission spectrum of the light emitter may be further modulated, and results of modulation are shown in FIG. 14A and FIG. 14B.

In FIG. 14A, the amplitude of the positive bias voltage in the AC bias voltage signal is 4 volts, and the amplitude of the negative bias voltage in the AC bias voltage signal is −8.5 volts. In FIG. 14B, the amplitude of the positive bias voltage in the AC bias voltage signal is 4 volts, and the amplitude of the negative bias voltage in the AC bias voltage signal is −10 volts. As shown in FIG. 14A and FIG. 14B, the amplitude of the negative bias voltage in the AC bias voltage signal may be modulated to obtain an emission spectrum different from the emission spectrum shown in FIG. 13. Similarly, the amplitude of the positive bias voltage in the AC bias voltage signal may be modulated to obtain a different emission spectrum. In addition, the amplitudes of the positive bias voltage and the negative bias voltage in the AC bias voltage signal may be modulated simultaneously to obtain a different emission spectrum.

In addition, in this experimental example, the infrared light emitter may emit mid-infrared light with a power of up to 300 nW.

In summary, the infrared light emitter in the embodiments and the experimental examples of the disclosure has good ability in modulation in optical properties such as polarization, wavelength, and emission spectrum. In addition, the infrared light emitter in the embodiments and experimental examples of the disclosure are easy to manufacture and help to simplify optical components, e.g., optical filters, polarizing elements, etc., required for the optical system working with the infrared light emitter.

It will be apparent to those skilled in the art that various modifications and variations can be made to the disclosed embodiments without departing from the scope or spirit of the disclosure. In view of the forthcoming, it is intended that the disclosure covers modifications and variations provided that they fall within the scope of the following claims and their equivalents.

What is claimed is:

1. An infrared light emitter comprising:
a substrate;
a first light-emitting layer;
a second light-emitting layer disposed on the substrate; and
a blocking layer disposed between the first light-emitting layer and the second light-emitting layer, the first light-emitting layer, the blocking layer, and the second light-emitting layer form a P-N-P junction or an N-P-N junction, the first light-emitting layer and the blocking layer form a first electroluminescent unit, and the second light-emitting layer and the blocking layer form a second electroluminescent unit.

2. The infrared light emitter according to claim 1, wherein an arm-chair lattice direction of the first light-emitting layer is orthogonal to an arm-chair lattice direction of the second light-emitting layer.

3. The infrared light emitter according to claim 1, wherein quantum efficiency of the first electroluminescent unit or the second electroluminescent unit reaches 0.3%.

4. The infrared light emitter according to claim 1, wherein power of the first electroluminescent unit or the second electroluminescent unit is up to 300 nW.

5. The infrared light emitter according to claim 1, wherein the first electroluminescent unit is independently driven from the second electroluminescent unit.

6. The infrared light emitter according to claim 5 further comprising a driving bias voltage modulator, wherein the driving bias voltage modulator is configured to independently drive the first electroluminescent unit or the second electroluminescent unit.

7. The infrared light emitter according to claim 1, wherein the blocking layer comprises an electron hole blocking layer, a material of the electron hole blocking layer comprises molybdenum disulfide, a material of the first light-emitting layer comprises one of black phosphorus and black arsenic phosphorus, and a material of the second light-emitting layer comprises the other one of the black phosphorus and the black arsenic phosphorus.

8. The infrared light emitter according to claim 6, wherein the driving bias voltage modulator is configured to change polarity of a bias voltage applied to the first electroluminescent unit or the second electroluminescent unit to adjust an emission wavelength of the first electroluminescent unit or the second electroluminescent unit.

9. The infrared light emitter according to claim 8, wherein the driving bias voltage modulator is configured to change polarity of a bias voltage applied to the first electroluminescent unit or the second electroluminescent unit to adjust an emission polarization direction of the first electroluminescent unit or the second electroluminescent unit.

10. The infrared light emitter according to claim 1, wherein the driving bias voltage modulator is configured to change polarity of a bias voltage applied to the first electroluminescent unit or the second electroluminescent unit to adjust an emission spectrum of the first electroluminescent unit or the second electroluminescent unit.

11. The infrared light emitter according to claim 1, wherein the first light-emitting layer, the second light-emitting layer, and the blocking layer comprise Group III-V or II-VI semiconductor materials.

* * * * *